(12) United States Patent
Ikeda et al.

(10) Patent No.: US 9,716,058 B2
(45) Date of Patent: Jul. 25, 2017

(54) POWER MODULE AND CONTROL INTEGRATED CIRCUIT

(71) Applicant: Mitsubishi Electric Corporation, Tokyo (JP)

(72) Inventors: Naoki Ikeda, Tokyo (JP); Hisashi Oda, Tokyo (JP); Maki Hasegawa, Tokyo (JP); Hisashi Kawafuji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/513,712

(22) Filed: Oct. 14, 2014

(65) Prior Publication Data
US 2015/0155228 A1    Jun. 4, 2015

(30) Foreign Application Priority Data

Dec. 2, 2013   (JP) .................................. 2013-249287

(51) Int. Cl.
*H01L 29/66* (2006.01)
*H01L 23/495* (2006.01)
(Continued)

(52) U.S. Cl.
CPC .... *H01L 23/49575* (2013.01); *H01L 23/4952* (2013.01); *H01L 23/49503* (2013.01);
(Continued)

(58) Field of Classification Search
CPC ......... H01L 23/49575; H01L 23/49503; H01L 23/49531; H01L 23/49541; H01L 23/49562; H01L 23/49513; H01L 23/49537; H01L 25/50; H01L 25/072; H01L 23/4952; H01L 2924/13055;
(Continued)

(56) References Cited

U.S. PATENT DOCUMENTS 5,291,065 A * 3/1994 Arai .................... H01L 23/5385
257/691
6,593,781 B2   7/2003 Yoshimura
(Continued)

FOREIGN PATENT DOCUMENTS

CN       1773858 A    5/2006
CN       102569241    7/2012
(Continued)

OTHER PUBLICATIONS

An Office Action issued by the Chinese Patent Office on Jan. 18, 2017, which corresponds to Chinese Patent Application No. 201410720919.8 and is related to U.S. Appl. No. 14/513,712; with English language partial translation.
(Continued)

*Primary Examiner* — Stephen W Smoot
*Assistant Examiner* — Vicki B Booker
(74) *Attorney, Agent, or Firm* — Studebaker & Brackett PC

(57) ABSTRACT

A power module includes one control IC and a plurality of reverse conducting insulated gate bipolar transistors (RC-IGBTs). The control IC has the functions of a high-voltage IC and a low-voltage IC. The plurality of RC-IGBTs are disposed on three of four sides of the control IC and connected to the control IC through only wires.

6 Claims, 14 Drawing Sheets

(51) Int. Cl.
*H01L 25/07* (2006.01)
*H01L 25/00* (2006.01)

(52) U.S. Cl.
CPC .. *H01L 23/49513* (2013.01); *H01L 23/49531* (2013.01); *H01L 23/49537* (2013.01); *H01L 23/49541* (2013.01); *H01L 23/49562* (2013.01); *H01L 25/072* (2013.01); *H01L 25/50* (2013.01); H01L 2224/45144 (2013.01); H01L 2224/48091 (2013.01); H01L 2224/48137 (2013.01); H01L 2224/48247 (2013.01); H01L 2924/13055 (2013.01)

(58) Field of Classification Search
CPC . H01L 2224/45144; H01L 2224/48137; H01L 2224/48247
See application file for complete search history.

(56) References Cited

U.S. PATENT DOCUMENTS

| | | | |
|---|---|---|---|
| 7,538,587 | B2 | 5/2009 | Iwagami et al. |
| 8,044,520 | B2 | 10/2011 | Akiyama et al. |
| 8,471,600 | B2 | 6/2013 | Domes |
| 8,587,101 | B2 | 11/2013 | Fernando et al. |
| 9,024,420 | B2 | 5/2015 | Fernando et al. |
| 9,093,434 | B2 | 7/2015 | Kimura et al. |
| 9,324,638 | B2 | 4/2016 | Fernando et al. |
| 9,530,724 | B2 | 12/2016 | Fernando et al. |
| 2003/0075783 | A1 | 4/2003 | Yoshihara et al. |
| 2005/0093121 | A1* | 5/2005 | Chen ............... H01L 23/4334 257/678 |
| 2006/0113838 | A1 | 6/2006 | Iwagami et al. |
| 2007/0181908 | A1 | 8/2007 | Otremba |
| 2007/0200537 | A1 | 8/2007 | Akiyama et al. |
| 2007/0216011 | A1 | 9/2007 | Otremba et al. |
| 2012/0146205 | A1 | 6/2012 | Fernando et al. |
| 2013/0082741 | A1 | 4/2013 | Domes |
| 2013/0105958 | A1 | 5/2013 | Fernando et al. |
| 2013/0256807 | A1 | 10/2013 | Cho et al. |
| 2014/0027891 | A1* | 1/2014 | Kimura ............... H01L 23/3107 257/675 |
| 2014/0061885 | A1 | 3/2014 | Fernando et al. |
| 2014/0367846 | A1* | 12/2014 | Nakagawa ........ H01L 23/49541 257/713 |
| 2015/0214140 | A1* | 7/2015 | Kim .................. H01L 23/49562 257/676 |
| 2015/0235932 | A1 | 8/2015 | Fernando et al. |
| 2015/0294952 | A1 | 10/2015 | Kimura et al. |

FOREIGN PATENT DOCUMENTS

| | | |
|---|---|---|
| CN | 103036547 A | 4/2013 |
| JP | H06-181286 A | 6/1994 |
| JP | 2003-189632 A | 7/2003 |
| JP | 2003-258163 A | 9/2003 |
| JP | 2005-277014 A | 10/2005 |
| JP | 2007-227763 A | 9/2007 |
| JP | 2009-283478 A | 12/2009 |
| JP | 2012-129489 A | 7/2012 |
| JP | 2013-081360 A | 5/2013 |
| TW | 201250962 A1 | 12/2012 |

OTHER PUBLICATIONS

An Office Action; "Notification of Reasons for Refusal," issued by the Japanese Patent Office on Oct. 18, 2016, which corresponds to Japanese Patent Application No. 2013-249287 and is related to U.S. Appl. No. 14/513,712; with partial English language translation.

An Office Action; "Decision of Final Rejection," issued by the Japanese Patent Office on May 30, 2017, which corresponds to Japanese Patent Application No. 2013-249287 and is related to U.S. Appl. No. 14/513,712; with partial English language translation.

* cited by examiner

F I G . 1
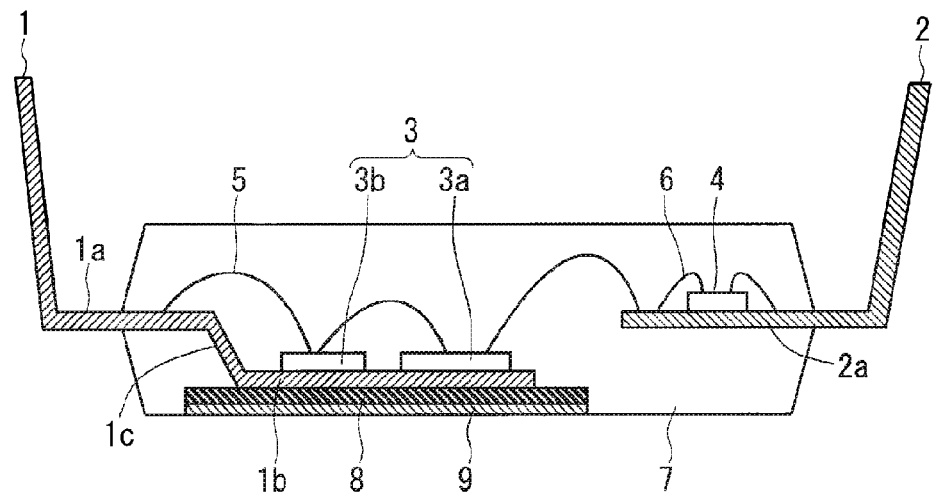
F I G . 2
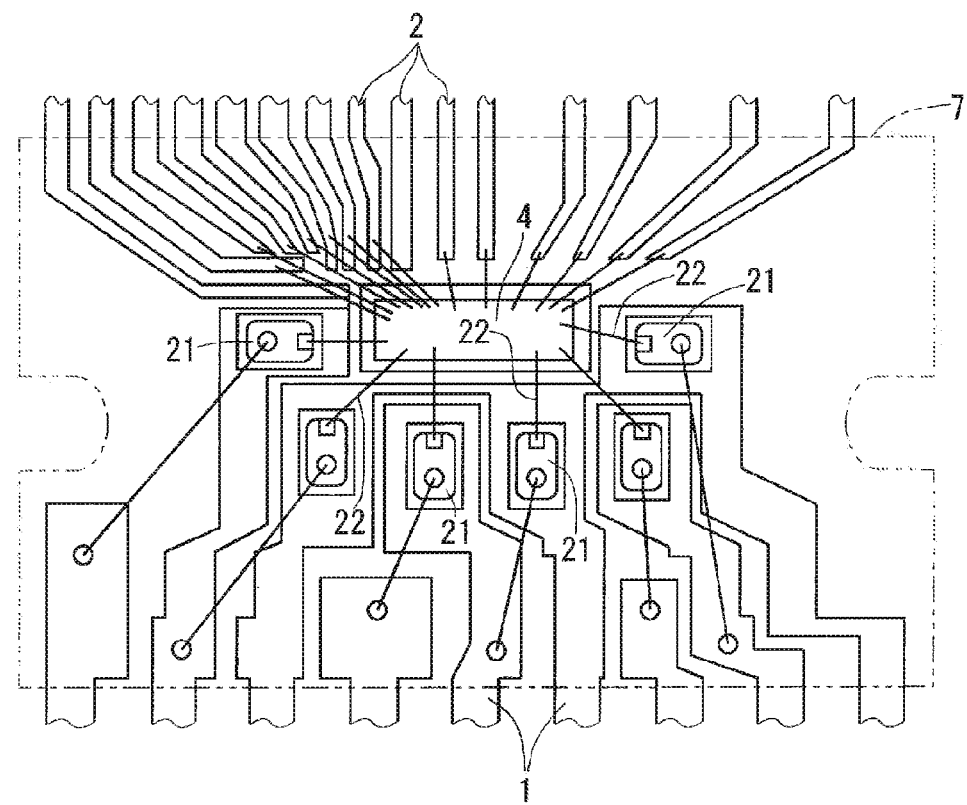

F I G . 3
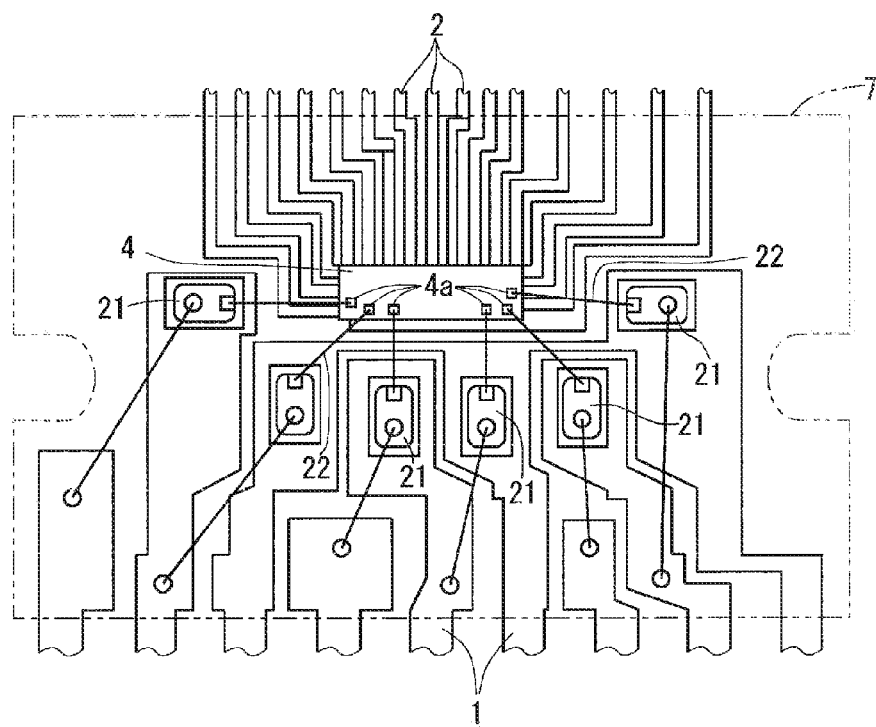

F I G. 4
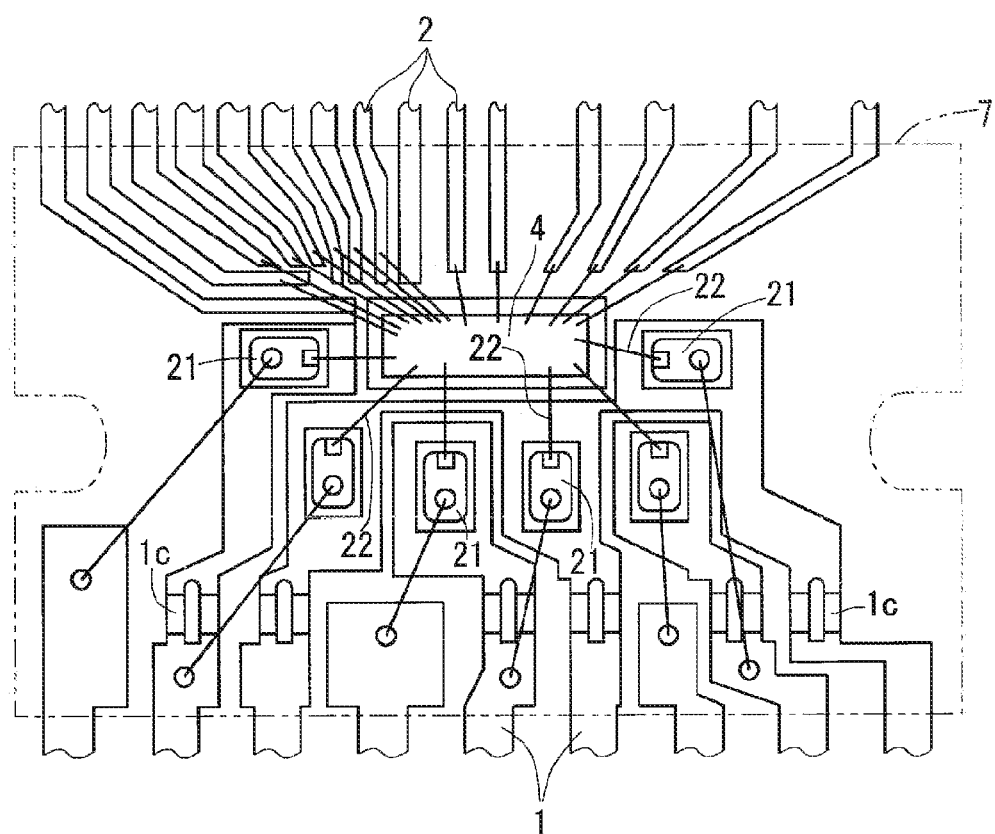

F I G . 5
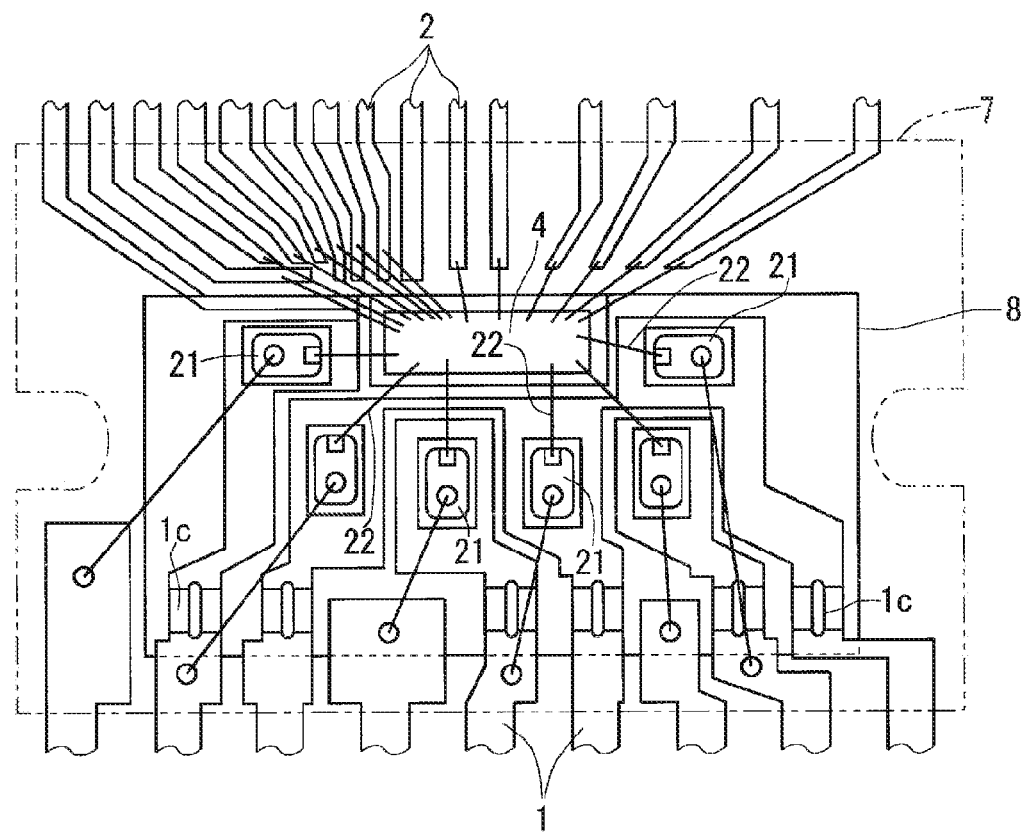

F I G . 1 3
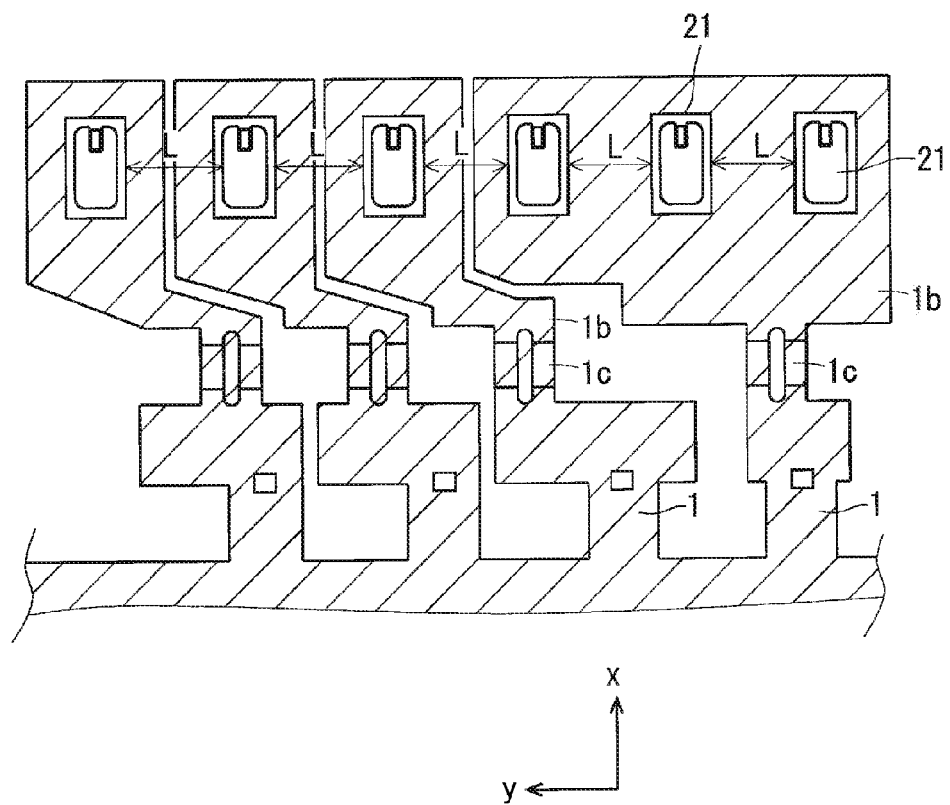

POWER MODULE AND CONTROL INTEGRATED CIRCUIT

BACKGROUND OF THE INVENTION

Field of the Invention

The present invention relates to a power module such as a power semiconductor device and to a method for manufacturing the same.

Description of the Background Art

Power modules including high-voltage integrated circuits (HVICs), low-voltage integrated circuits (LVICs), power transistors, free wheeling diodes (FWDis), and frames on which they are mounted have been developed as power modules of power semiconductor devices (for example, Japanese Patent Application Laid-Open No. 2003-189632).

In recent times, the price competition is increasingly competitive in the power module market, requiring further cost-reduction and miniaturization.

The frames are designed side by side in a single row (for example, in a single horizontal row) to be compatible with the variety of the package sizes of the power modules in addition to the manufacturing constraints, such as the transmission lanes of the frames of the power modules and the operating range in the die bonders and the molding devices. Consequently, the production amount of the power modules is limited in the method for designing the conventional frames in which the number of frames producible from one metal plate is determined by the package size.

SUMMARY OF THE INVENTION

The present invention has been made in view of the above-mentioned problems, and an object thereof is to provide a technique capable of miniaturizing a power module or improving productivity of the power module.

The present invention is the power module that includes: one control integrated circuit (control IC) having the functions of a high-voltage integrated circuit (high-voltage IC) and a low-voltage integrated circuit (low-voltage IC); and a plurality of reverse conducting insulated gate bipolar transistors (RC-IGBTs) disposed on three of four sides of the control IC and connected to the control IC through only wires.

The power module includes the one control IC having the functions of the high-voltage IC and low-voltage IC and the RC-IGBTs. Thus, the miniaturization of the power module can be achieved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view showing a configuration of a related power module;

FIG. 2 is a top view showing an inner configuration of a power module according to a first preferred embodiment;

FIG. 3 is a top view showing an inner configuration of a power module according to a second preferred embodiment;

FIGS. 4 and 5 are top views showing inner configurations of a power module according to a third preferred embodiment;

FIG. 13 is a view showing steps of manufacturing a power module according to a seventh preferred embodiment;

DESCRIPTION OF THE PREFERRED EMBODIMENTS

<First Preferred Embodiment>

Figure 6:
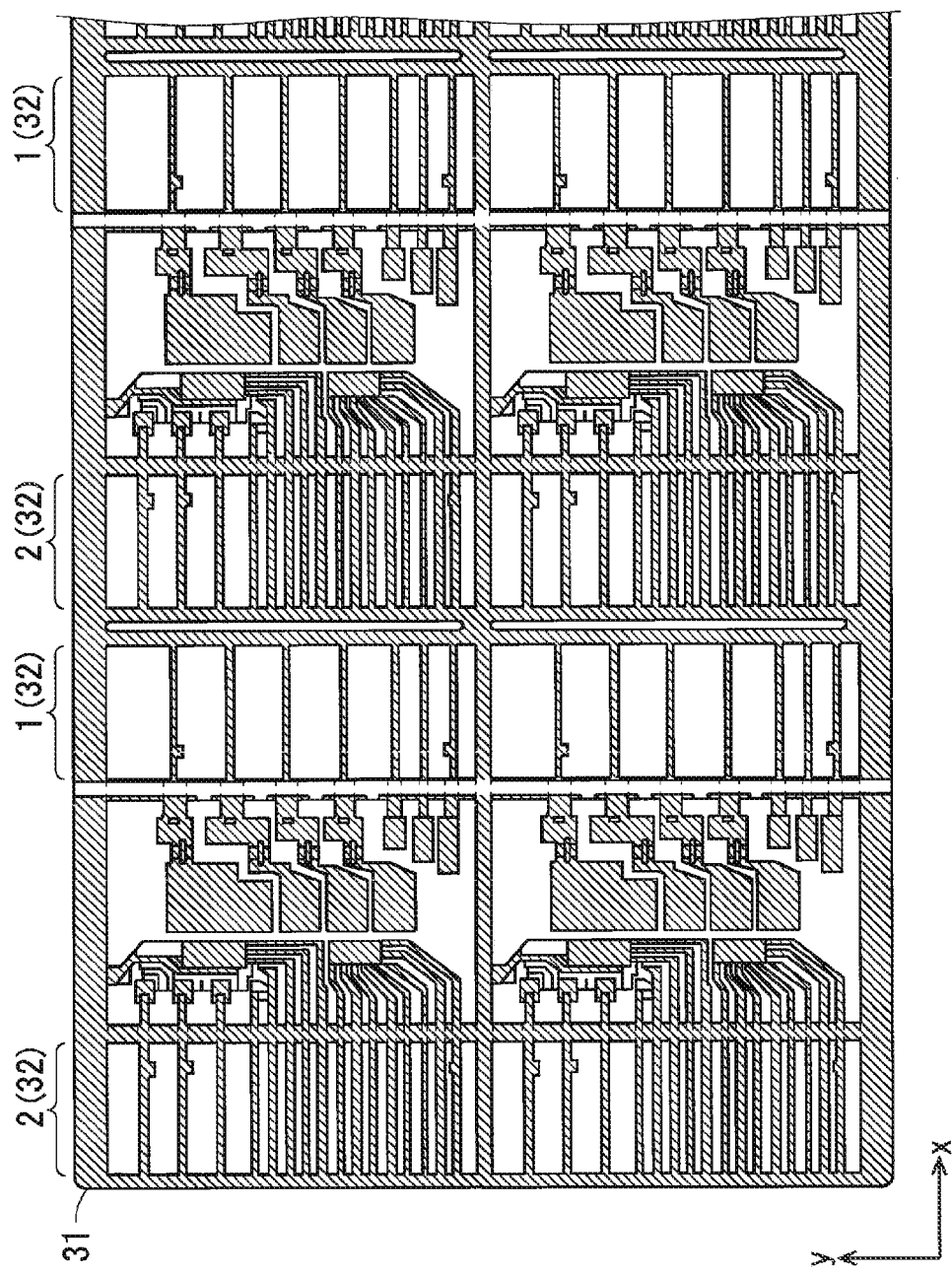
FIGS. 6 to 10 are views showing steps of manufacturing a power module according to a fourth preferred embodiment.

Prior to descriptions of a configuration of a power module according to a first preferred embodiment of the present invention, a power module related to that (hereinafter referred to as a "related power module") will be described.

FIG. 1 is a cross-sectional view showing a configuration of the related power module (transfer molding type power semiconductor device). The related power module includes first frames 1, second frames 2, power chips 3, one control integrated circuit (control IC) 4, a thick aluminum wire 5, thin gold wires 6, a molding resin 7, an insulating sheet 8, and a copper foil 9.

The first frames 1 include extending portions 1a that extend in a horizontal direction and first die pads 1b. On the first die pads 1b, the power chips 3 are mounted, and the first die pads 1b are connected to the power chips 3. A step 1c is provided in a height direction (vertical direction of FIG. 1) between the extending portion 1a and the first die pad 1b.

The second frames 2 have second die pads 2a extending in the horizontal direction corresponding to the extending portions 1a. In other words, the position in the height direction of the second die pad 2a of the second frame 2 is the same or substantially the same as the position in the height direction of the extending portion 1a of the first frame 1. Here, the above-mentioned step 1c is provided in the first frame 1 such that the first die pad 1b is located lower than the second die pad 2a (the first die pad 1b is disposed close to the bottom surface of the molding resin 7), and this also enables to reduce a thickness of the insulating sheet 8. On the second die pads 2a, the control IC 4 is mounted, and the second die pads 2a are connected to the control IC 4.

Control signal is input to the second frame 2 from the outside, and then the control signal input to the second frame 2 is output to the control IC 4. The second frames 2 include not only the frame that includes the second die pad 2a but also the frame that does not include the second die pad 2a on which the control IC 4 is mounted and is connected to the control IC 4 through the thin gold wire 6.

The power chips 3 include power transistor chips 3a and FWDi chips 3b, and the chip 3a and the chip 3b are connected to the first die pad 1b of the first frame 1 with a solder (not shown).

The control IC 4 is connected to the second die pads 2a of the second frames 2 with a resin paste including metal (not shown). The control IC 4 has functions of the HVIC and LVIC and controls the power chips 3 in response to the control signals from the second frame 2.

The thick aluminum wire 5 connects between the power chips 3 and the first frame 1, and the thin gold wire 6 connects between the control IC 4 and the second frame 2. A wire similar to the thick aluminum wire or the thin gold wire connects between the power chips 3 or between the power chips 3 and the second frame 2.

The insulating sheet 8 and the copper foil 9 are disposed in the stated order under the first die pad 1b of the first frame 1, and a portion of the copper foil 9 is exposed from the bottom surface of the molding resin 7 to the outside.

The molding resin 7 covers the structural components as described above except for portions of the first frame 1 and second frame 2 and the lower surface of the copper foil 9. The portions of the first frame 1 and second frame 2, which are exposed from the molding resin 7, are lead terminals 11 subjected to a plating process, and the lead terminals 11 are mounted on a substrate (not shown) or the like. To efficiently dissipate the heat generated upon the operation of the power chips 3, the first frame 1 and the second frame 2 are formed of materials, such as a copper and a copper alloy having a relatively low heat resistance.

In the related power module as described above, the one control IC 4 having the functions of the HVIC and LVIC achieves the miniaturization and the cost-reduction to some extent, but there remains room for further improvement. In the power module according to the first preferred embodiment, further miniaturization and cost-reduction can be achieved.

FIG. 2 is a top view showing an inner configuration of the power module according to the first preferred embodiment. In the first preferred embodiment, the same or similar components as those described above are denoted by the same references and will be described below.

The power module according to the first preferred embodiment includes the first frames 1, the second frames 2, the one control IC 4, the molding resin 7, a plurality (six in FIG. 2) of reverse conducting insulated gate bipolar transistors (RC-IGBTs) 21, and gate wires 22. To simplify the description, FIG. 2 shows the molding resin 7 by a phantom line (chain double-dashed line). Similarly, the molding resin 7 may also be shown by the phantom line in the views subsequent to FIG. 2.

The RC-IGBTs 21 are reverse conducting IGBTs having the FWDis built into the IGBTs, and the RC-IGBTs 21 have functions of the FWDi and IGBT. In other words, the power module according to the first preferred embodiment includes the RC-IGBTs 21 instead of the power transistor chip 3a and the FWDi chip 3b of the related power module. For example, the RC-IGBTs disclosed in Japanese Patent Application Laid-Open No. 2012-186899 may be applied to the RC-IGBTs 21. The RC-IGBTs 21 are connected to the first die pads 1b of the first frames 1 with the solder (not shown).

The plurality of RC-IGBTs 21 are dispersedly disposed on three (the left side, right side, and lower side except for the upper side close to the second frames 2 in FIG. 2) of four sides of the control IC 4. Gate terminals of each of the RC-IGBTs 21 are connected to an output terminal of the control IC 4 through only the gate wires 22 (wires).

In the power module according to the first preferred embodiment as described above, the one control IC 4 has the functions of the HVIC and LVIC, to thereby reduce the number of control ICs, though the conventional configuration has required the plurality of control ICs. Thus, the power module can be miniaturized while the costs can be reduced. The RC-IGBTs 21 are provided instead of the power transistor chips 3a and the FWDi chips 3b, and this can reliably miniaturize the power module while the costs can be further reduced. In addition, the control IC 4 is connected to the RC-IGBTs 21 through only the gate wires 22, allowing for the miniaturization of the package. Furthermore, disposing the plurality of RC-IGBTs 21 dispersedly on the three of the four sides of the control IC 4 can suppress the wire length variation of the gate wires 22 connecting between the control IC 4 and each of the RC-IGBTs 21, and thus the characteristic variation of each phase can be suppressed.

<First Modification of First Preferred Embodiment>

For the operation time of air conditioners throughout the year, the heating intermediate operation period is the longest during the year and has the low output current values of motors, and thus it is preferable to improve the loss during this period as much as possible. Consequently, the power module may include metal oxide semiconductor field effect transistors (MOSFETs) formed of a silicon, that is Si-MOSFET, in place of the RC-IGBTs 21. The configuration including the Si-MOSFETs can improve the loss in the low current region. Therefore, in a case where the power module is mounted on the air conditioner, it may have the effect of improving the annual performance factor (APF) that indicates the energy saving effect of the air conditioner.

<Second Modification of First Preferred Embodiment>

The power modules may include metal oxide semiconductor field effect transistors (MOSFETs) formed of a silicon carbide, that is SiC-MOSFET, in place of the RC-IGBTs 21. The SiC has heat dissipation properties superior to the Si, and thus the chip can be miniaturized as long as it has approximately the same heat dissipation properties as the RC-IGBTs 21 and the Si-MOSFETs, which allows for the miniaturization of the package. Moreover, the chip in approximately the same size may improve the heat dissipation properties. Thus, in a case where the power module is mounted on the air conditioner, the improvements in the product performance can reduce the costs of the air conditioning system in total (for example, miniaturization of a heat dissipation fin by improving the heat dissipation properties).

<Third Modification of First Preferred Embodiment>

The first preferred embodiment describes the configuration including the RC-IGBTs 21 connected to the first die pads 1b of the first frames 1 with the solder (not shown), namely, the configuration including the solder used as the die bonder, but this is not restrictive. For example, the RC-IGBTs 21 may be configured to be connected to the first die pads 1b of the first frames 1 with a resin die bonding agent (not shown) such as a silver paste instead of the solder. In this manner, the die bonding step of the RC-IGBTs 21 and the die bonding step of the control IC 4 can be performed by using the same die bonding apparatus. In addition, using the resin die bonding agent such as the silver paste can reduce assembly processing costs.

<Second Preferred Embodiment>

FIG. 3 is a top view showing an inner configuration of a power module according to a second preferred embodiment of the present invention. In the second preferred embodiment, the same or similar components as those described above are denoted by the same references and will be described below.

The control IC 4 according to the second preferred embodiment includes first pads 4a provided on a front surface of the control IC 4 and second pads (not shown) provided on a back surface of the control IC 4. Here, the first pads 4a are connected to the RC-IGBTs 21 through the gate wires 22, and the second pads are connected to the second frames 2 through the resin paste including metal.

In the power module according to the second preferred embodiment as described above, the gate wires 22 are not required to connect between the control IC 4 and the second frames 2, whereby the steps of forming the wire bond connecting therebetween can be omitted. Therefore, the assembly processing costs and manufacturing tasks can be reduced.

<Third Preferred Embodiment>

FIG. 4 is a top view showing an inner configuration of a power module according to a third preferred embodiment of the present invention. In the third preferred embodiment, the same or similar components as those described above are denoted by the same references and will be described below.

In the power module according to the third preferred embodiment similarly to the related power module (FIG. 1), the steps 1c are provided in the first frames 1 in the height direction such that the first die pads 1b are located lower than the second die pads 2a (the first die pads 1b are disposed close to the bottom surface of the molding resin 7).

In the power module according to the third preferred embodiment as described above, the RC-IGBTs 21 are located close to the outside of the molding resin 7, whereby the improvements in the heat dissipation properties can be expected from the heat generation of the RC-IGBTs 21. Consequently, in a case where the power module is mounted on the air conditioner, the improvements in the product performance can reduce the costs of the air conditioning system in total (for example, miniaturization of a heat dissipation fin by improving the heat dissipation properties).

The power module according to the third preferred embodiment is not limited to the configuration shown in FIG. 4 as described above. For example, the power module as shown in FIG. 5 may further include the insulating sheet 8 disposed under the first die pads 1b similarly to the related power module (FIG. 1). This configuration enables the large capacity, whereby the withstanding voltage can be improved under the same current rating. The above-mentioned steps 1c can reduce the thickness of the insulating sheet 8, whereby the improvements in the heat dissipation properties can also be expected from this viewpoint.

<Fourth Preferred Embodiment>

FIGS. 6 to 10 are views showing steps of manufacturing a power module according to a fourth preferred embodiment of the present invention. In the fourth preferred embodiment, the same or similar components as those described above are denoted by the same references and will be described below.

First, a metal plate is selectively punched to form a pattern, to thereby shape a metal shaping body (shaping body) 31 as shown in FIG. 6. The metal shaping body 31 includes a plurality of frames 32 arranged in a vertical direction (y direction in FIG. 6) to an extending direction (x direction in FIG. 6) of the frames 32.

In the fourth preferred embodiment, the plurality of frames 32 for a plurality of the power modules include the first frames 1 to be connected to the RC-IGBTs 21 (semiconductor devices) in the next step and the second frames 2 to be connected to the control IC 4 (semiconductor device) in the next step. In the metal shaping body 31 as shown in FIG. 6, two of the power modules and two or more of the power modules are arranged in y direction and in x direction, respectively. Note that the arrangement of the power modules is not limited to this, so that the one power module or three or more of the power modules may be arranged in y direction and the one power module may be arranged in x direction.

The plurality of power modules head for the same direction. The first frames 1 of each power module are disposed on +x direction side and the second frames 2 thereof are disposed on −x direction side. Here, space between the plurality of power modules is also the same in the horizontal direction (x direction and y direction in FIG. 6).

Figure 7:
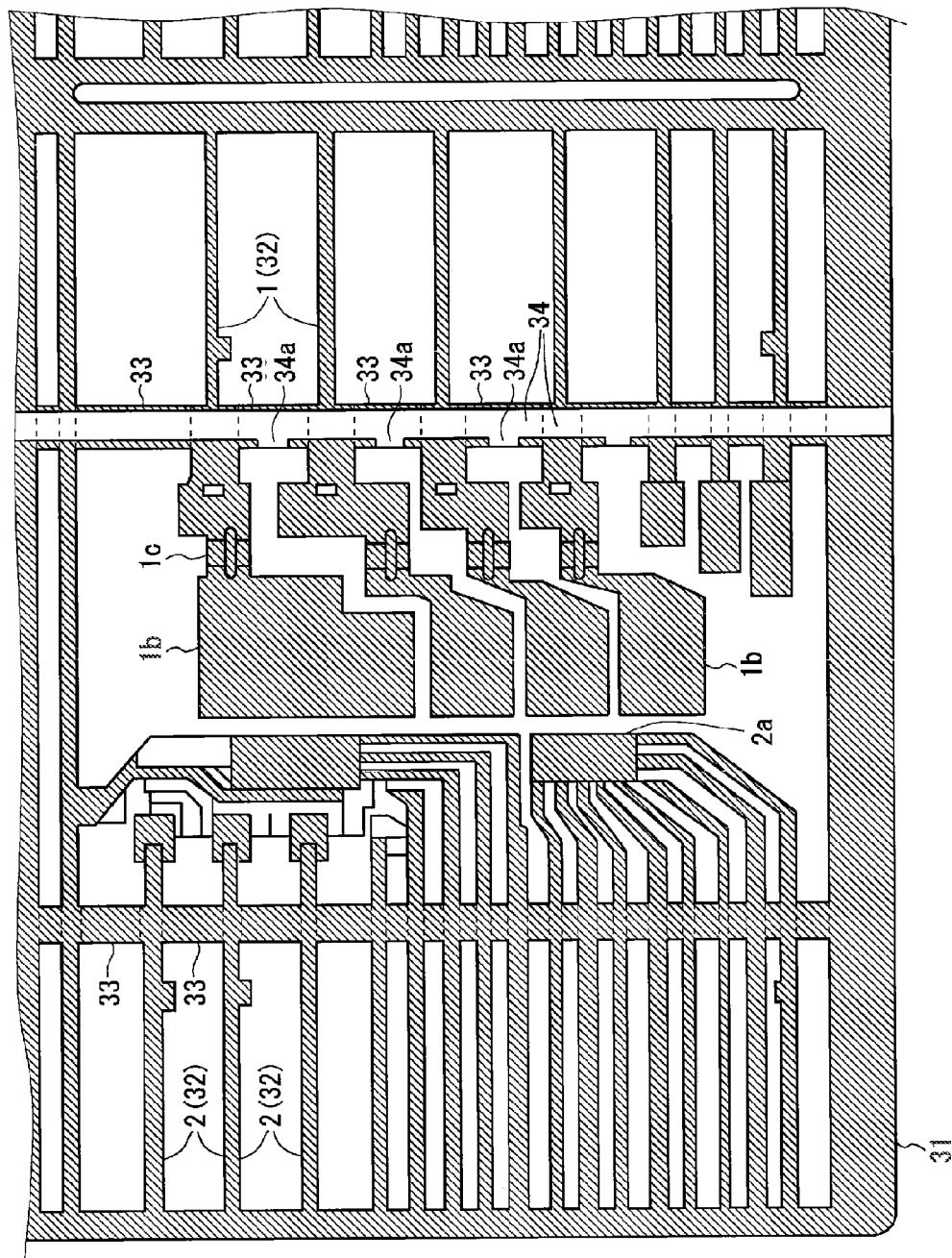

FIG. 7 is a view showing a portion corresponding to the one power module of the metal shaping body 31. As shown in FIG. 7, the metal shaping body 31 also includes the first die pads 1b of the first frames 1 and the second die pads 2a of the second frames 2.

Moreover, the metal shaping body 31 includes not only the plurality of frames 32 (first frames 1 and second frames 2) but further includes tie bars 33 connecting between the first frames 1 or between the second frames 2. A resin runner 34 serving as a channel for injecting the resin is provided in the first frames 1 (predetermined frames 32) and the tie bar 33 (predetermined tie bar 33) on the first frame 1 side. The resin runner 34 may be formed as a groove pattern on the upper surfaces of the first frames 1 and the tie bar 33 or as a hollow pattern inside the first frames 1 and the tie bar 33.

Next, the plurality of semiconductor devices (RC-IGBTs 21 and control IC 4) are connected to the plurality of frames 32 (first frames 1 and second frames 2). Here, the RC-IGBTs 21 are mounted on the first die pads 1b of the first frames 1 and connected thereto with the die bond while the control IC 4 is mounted on the second die pads 2a of the second frames 2 and connected thereto with the die bond. Then, the first frames 1, the second frames 2, the RC-IGBTs 21, and the control IC 4 are wire bonded, so that the gate wires 22 or the like are formed. To simplify the view, the RC-IGBTs 21 and the control IC 4 are not shown, but the RC-IGBTs 21 and the control IC 4 are connected to the first frames 1 and the second frames 2 similarly to the first to third preferred embodiments, for example. In the following views, the RC-IGBTs 21 and the control IC 4 may also not be shown to simplify the views. In the fourth preferred embodiment, as shown in FIG. 1, the insulating sheet 8 and the copper foil 9 may also be disposed in the stated order under the first die pads 1b.

Figure 8:
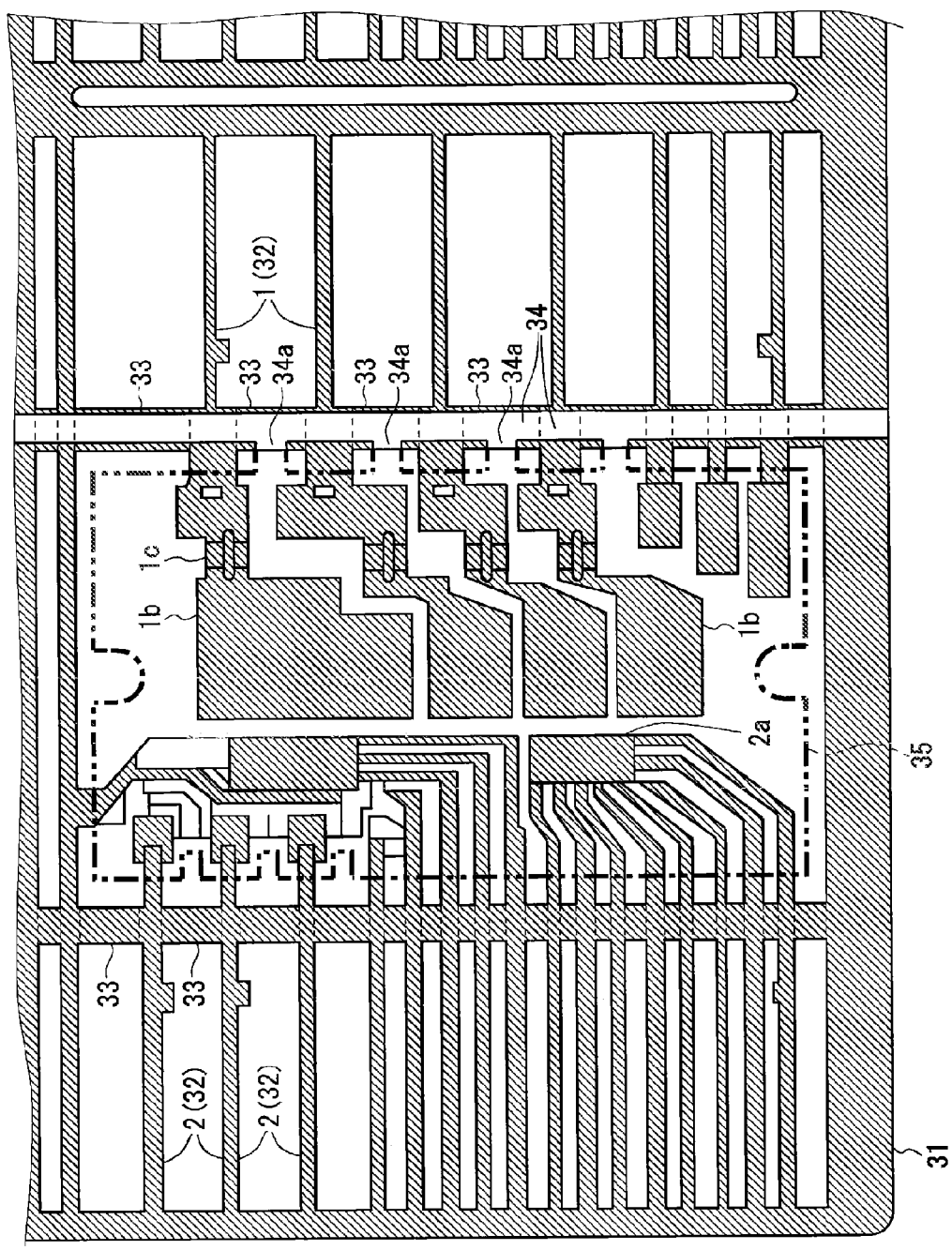

The metal shaping body 31 connected to the RC-IGBTs 21 and the control IC 4 is disposed inside a die for molding the molding resin 7 (hereinafter referred to as a "molding die"). FIG. 8 shows an inner space 35 of the molding die indicated by a chain double-dashed line.

Figure 9:
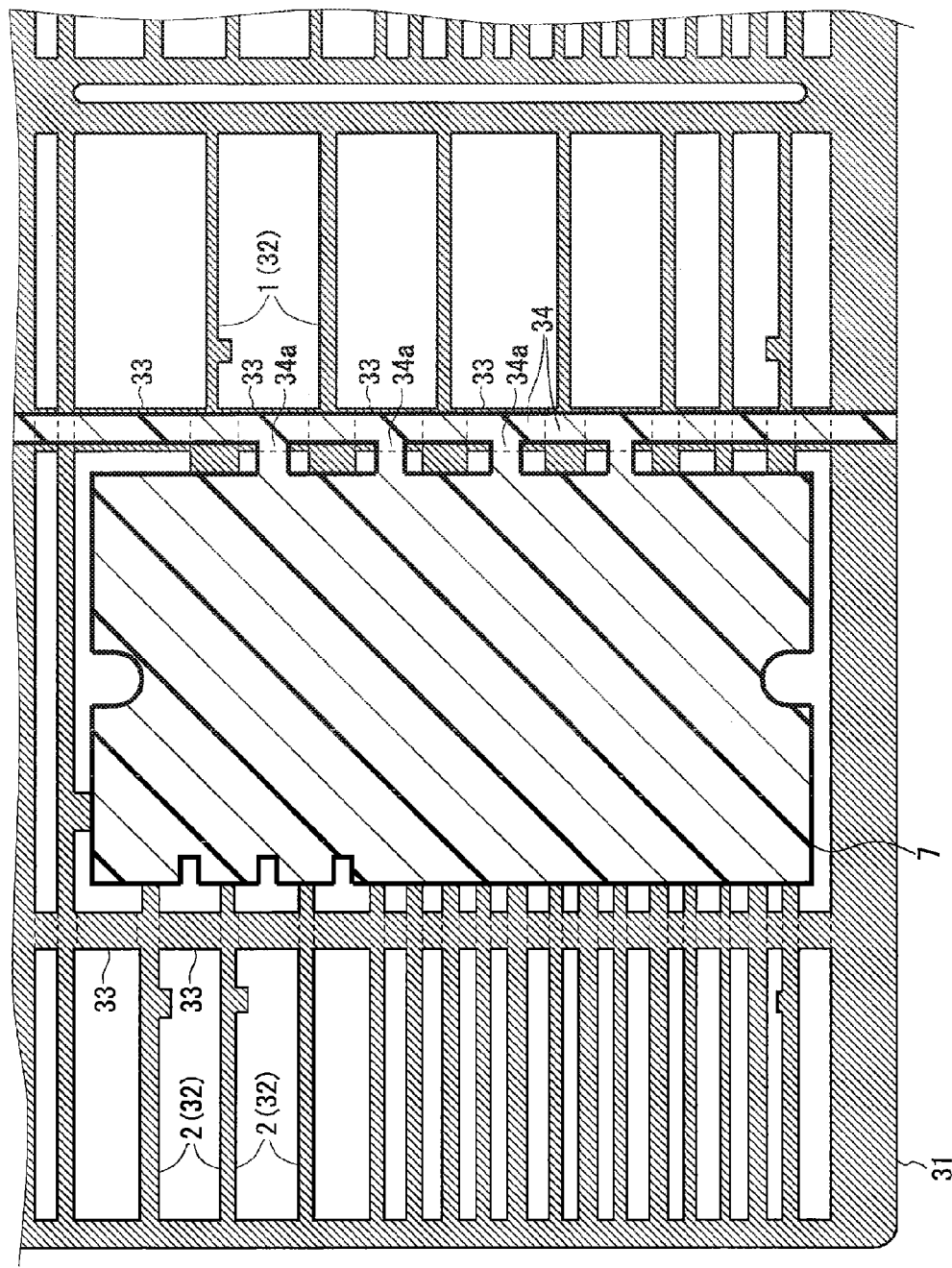

As indicated by the chain double-dashed line in FIG. 8, the metal shaping body 31 is disposed in the molding die such that outlets (resin injection gates 34a) of the resin runner 34 disposed in the molding die communicate with the inner space 35 of the molding die. In this state, the resin before solidification is injected into the inner space 35 of the molding die via the resin runner 34 and the resin injection gates 34a, and the resin subsequently solidifies. As shown in FIG. 9, this molds the molding resin 7 that covers the plurality of semiconductor devices (RC-IGBTs 21 and control IC 4) and also partially covers the metal shaping body 31.

In other words, in the fourth preferred embodiment, the resin is injected from the resin runner 34 by a side gate method to mold the molding resin 7. The metal shaping body 31 covered with the molding resin 7 includes the first die pads 1b of the first frames 1, the second die pads 2a of the second frames 2, and the like.

Figure 10:
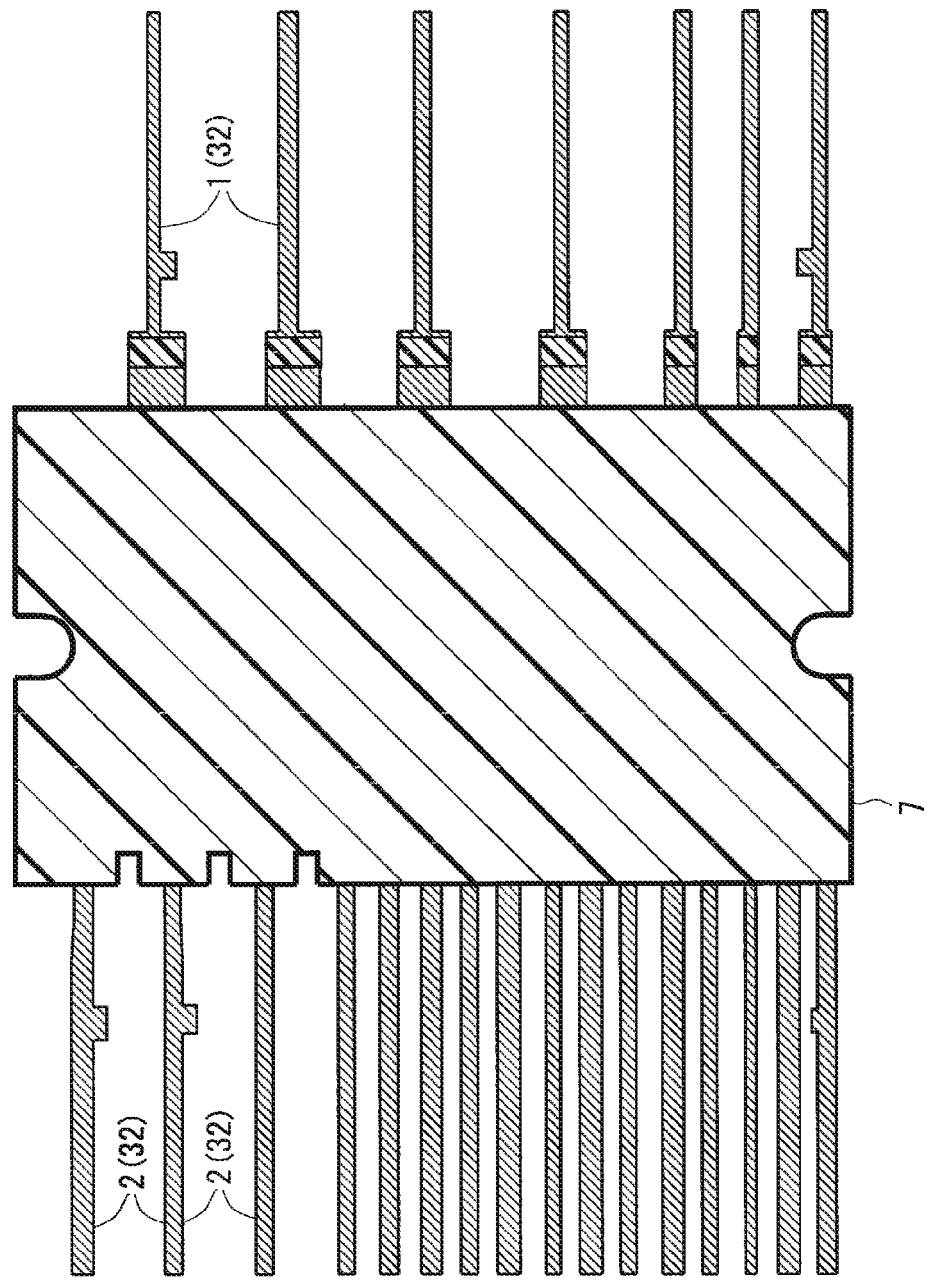

Next, portions of the metal shaping body 31 between the plurality of frames 32 are cut, the portions being exposed from the molding resin 7. Herein, the cutting removes the tie bars 33 between the first frames 1 and the tie bars 33 between the second frames 2, whereby the power module as shown in FIG. 10 is completed.

The plurality of frames of the metal shaping body that is shaped by the conventional method for manufacturing the power modules are arranged in a single row along the extending direction (x direction in FIG. 6). In contrast, the plurality of frames 32 of the metal shaping body 31 that is shaped by the method for manufacturing the power modules according to the fourth embodiment are arranged in plural rows along the extending direction. In other words, the plurality of frames 32 are arranged also in the vertical direction (y direction in FIG. 6) to the extending direction. Therefore, the number of frames 32 producible from the metal shaping body 31 can be increased more than before, whereby productivity can be improved.

In the fourth preferred embodiment, the resin is injected into the resin runner 34 provided in the first frames 1 and the tie bar 33 on the first frame 1 side by the side gate method to mold the molding resin 7. This can inject the resin from the position of the tie bar 33 even if the frames 32 are arranged in the plural rows, whereby the productivity can be improved.

Similarly to the fourth preferred embodiment, the configuration including the plurality of power modules in the metal shaping body 31 that head for the same direction and are spaced at regular intervals in the horizontal direction can suppress the deformation and separation of the wires caused by the flow of the resin while simultaneously injecting the resin of the molding resin 7 for the plurality of power modules.

<Modification of Fourth Preferred Embodiment>

In the fourth preferred embodiment, the resin is injected into the resin runner 34 provided in the first frames 1 and the tie bar 33 on the first frame 1 side to mold the molding resin 7, but this is not restrictive. For example, the molding resin 7 may also be molded without the above-mentioned resin runner 34 by disposing a resin injection gate in a space surrounded with the adjacent first frames 1 and the tie bar 33 connecting the adjacent first frames 1 and by injecting the resin from the resin injection gate (not shown).

In the fourth preferred embodiment, the description is given that the case where the RC-IGBTs 21 are applied to the semiconductor devices connected to the second die pads 2*a*. However, this is not restrictive, and the power chips 3 may be applicable instead of the RC-IGBTs 21. This applies to a fifth preferred embodiment and to subsequent embodiments.

<Fifth Preferred Embodiment>

Figure 11:
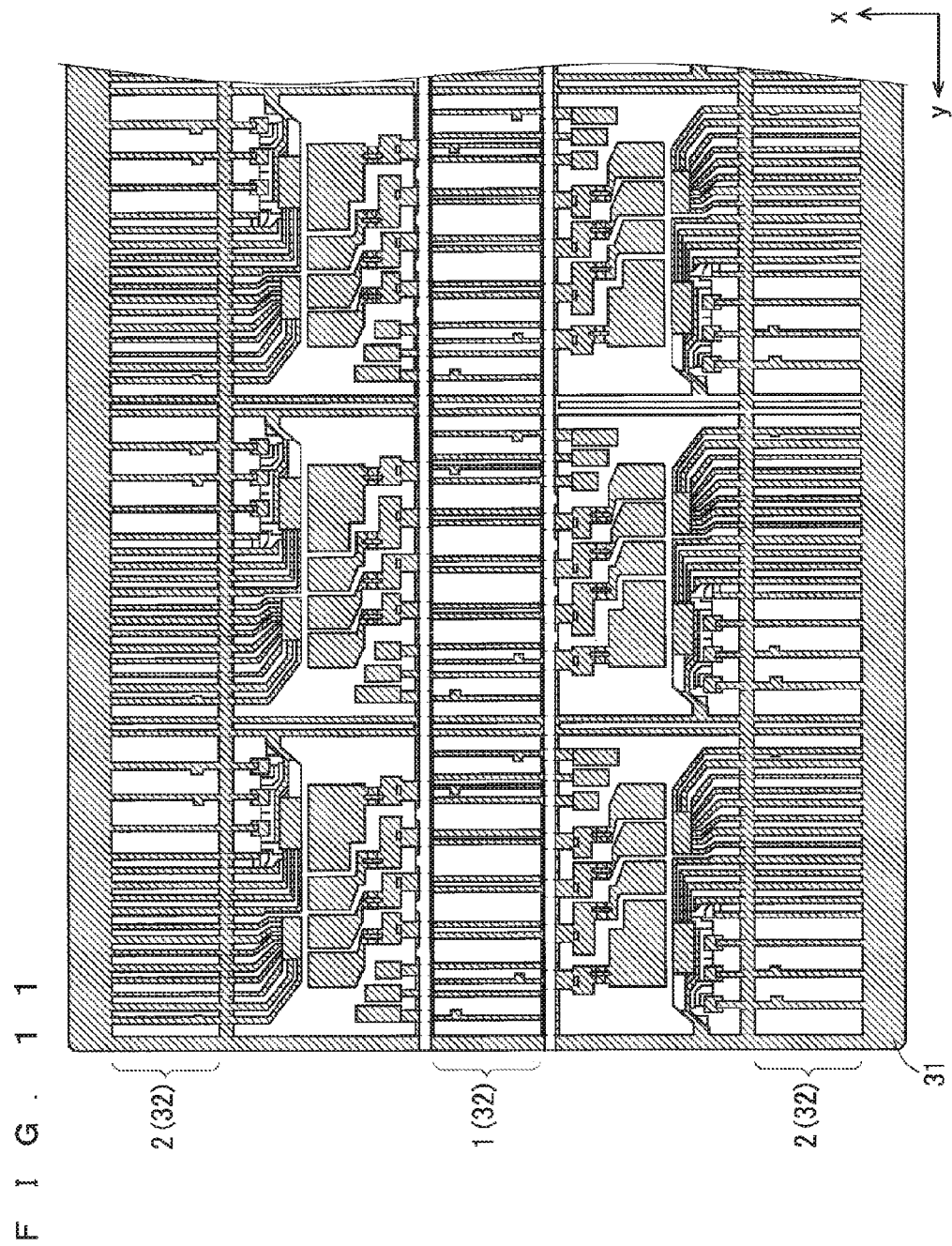
FIG. 11 is a view showing steps of manufacturing a power module according to a fifth preferred embodiment.

FIG. 11 is a view showing steps of manufacturing a power module according to a fifth preferred embodiment of the present invention. In the fifth preferred embodiment, the same or similar components as those described above are denoted by the same references and will be described below.

In the fourth preferred embodiment, the plurality of power modules in the metal shaping body 31 head for the same direction (FIG. 6). In contrast, in the fifth preferred embodiment, the plurality of power modules in the metal shaping body 31 head for the different directions as shown in FIG. 11.

Specifically, the power modules on −x side (first power modules) of the plurality of power modules in FIG. 11 head for the same direction as that of the power modules in FIG. 6, the first frames 1 are disposed on +x direction side, and the second frames 2 are disposed on −x direction side. On the other hand, the power modules on +x side (second power modules) of the plurality of power modules in FIG. 11 head for the same direction as that of the power modules in FIG. 6 rotated by 180 degrees, the first frames 1 are disposed on −x direction side, and the second frames 2 are disposed on +x direction side. In other words, the power modules on +x side are disposed adjacent to the power modules on −x side and also disposed opposite in direction thereto.

In the metal shaping body 31, the first frames 1 of the power modules on −x side and the first frames 1 of the power modules on +x side are arranged side by side in the vertical direction (y direction). Note that in order to prevent the first frames 1 of the power modules on −x side from overlapping and contacting the first frames 1 of the power modules on +x side, the positions of these first frames 1 are appropriately adjusted upon the design of the metal shaping body 31.

After shaping the metal shaping body 31 shown in FIG. 11, similarly to the fourth preferred embodiment, the metal shaping body 31 is connected to the semiconductor devices or the like, the molding resin 7 is molded, and then the portions of the metal shaping body 31 are selectively cut, the portions being exposed from the molding resin 7. In the cutting step of the fifth preferred embodiment, the potions on +x side of the first frames 1 of the power modules on −x side are cut, and the portions on −x side of the first frames 1 of the power modules on +x side are cut.

The method for manufacturing the power modules according to the fifth preferred embodiment as described above can form the first frames 1 of one power module in the gap between the first frames 1 of another power module. Therefore, the number of frames 32 producible from the metal shaping body 31 can be increased more than before, whereby the productivity can be improved. Since the gap between the first frames 1 is relatively wider than the gap between the second frames 2, the metal shaping body 31 can be shaped more easily than by forming the second frame 2 of one power module in the gap between the second frames 2 of another power module.

<Sixth Preferred Embodiment>

Figure 12:
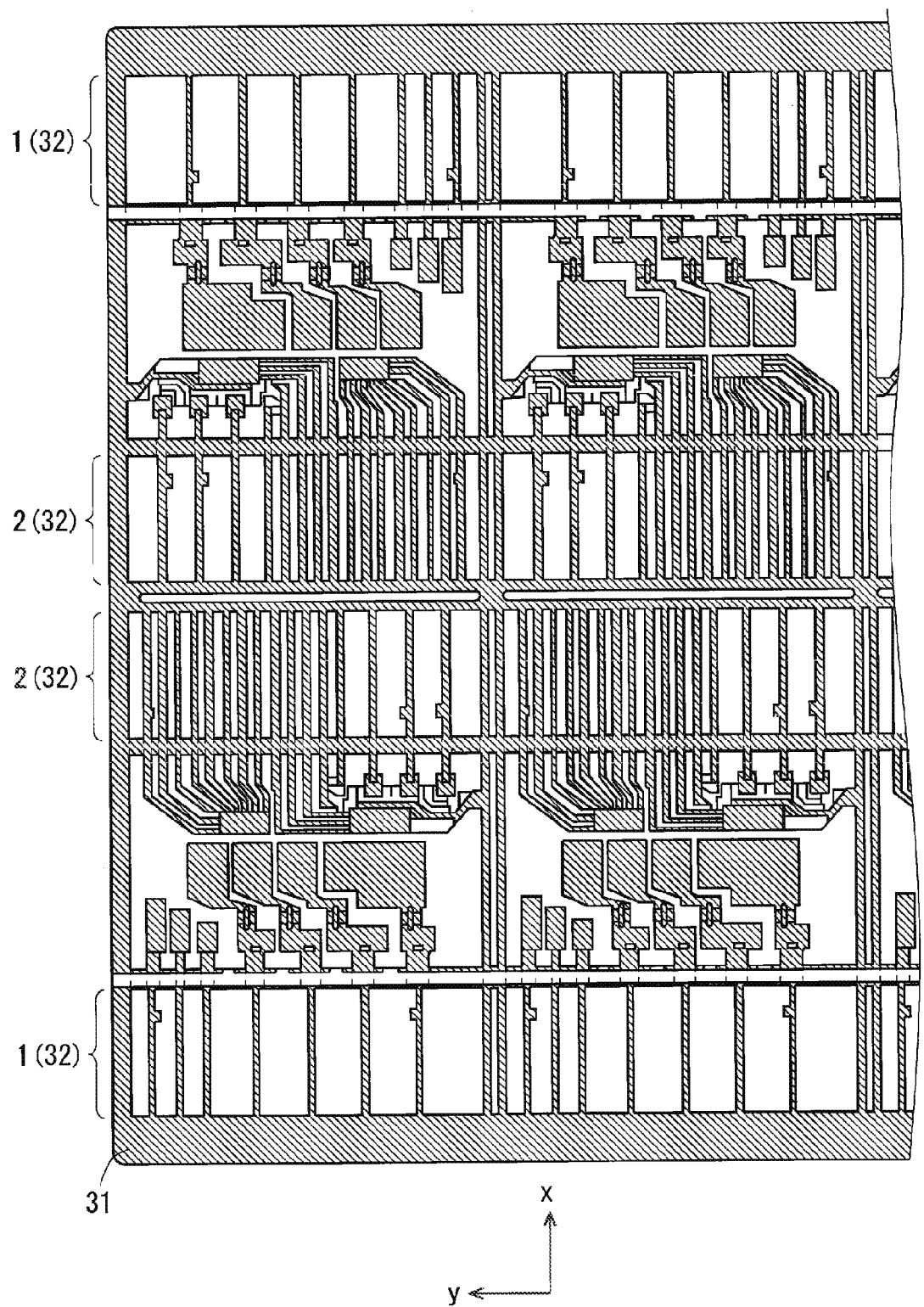
FIG. 12 is a view showing steps of manufacturing a power module according to a sixth preferred embodiment.

FIG. 12 is a view showing steps of manufacturing a power module according to a sixth preferred embodiment of the present invention. In the sixth preferred embodiment, the same or similar components as those described above are denoted by the same references and will be described below.

In the sixth preferred embodiment, as shown in FIG. 12, the plurality of power modules in the metal shaping body 31 head for the different directions.

Specifically, the power modules on +x side of the plurality of power modules in FIG. 12 head for the same direction as that of the power modules in FIG. 6, the first frames 1 are disposed on +x direction side, and the second frames 2 are disposed on −x direction side. On the other hand, the power modules on −x side of the plurality of power modules in FIG. 12 head for the same direction as that of the power modules in FIG. 6 rotated by 180 degrees, the first frames 1 are disposed on −x direction side, and the second frames 2 are disposed on +x direction side. Thus, the first frame 1 of each power module is disposed to be located closer to an end portion of the metal shaping body 31 than the second frame 2 of each power module.

After shaping the metal shaping body 31 shown in FIG. 12, similarly to the fourth preferred embodiment, the metal shaping body 31 is connected to the semiconductor devices or the like, the molding resin 7 is molded, and then the portions of the metal shaping body 31 are selectively cut, the portions being exposed from the molding resin 7.

The method for manufacturing the power modules according to the sixth preferred embodiment as described above disposes the first frames 1 to be located closer to the end portions of the metal shaping body 31 than the second frames 2. This can suppress, for example, the deformation and separation of the wires caused by the flow of the resin when the resin is injected into the above-mentioned resin runner 34. Also, when the resin is injected from the resin injection gates disposed in the space surrounded with the adjacent first frames 1 and the tie bar 33 similarly to the modification of the fourth preferred embodiment for example, the deformation and separation of the wires caused by the flow of the resin can be suppressed. Furthermore, the resin of the molding resin 7 can be injected simultaneously from both the end portions (+x side end portion and −x side end portion in FIG. 12) of the metal shaping body 31, whereby the productivity can be improved.

<Seventh Preferred Embodiment>

FIG. 13 is a view showing steps of manufacturing a power module according to a seventh preferred embodiment of the present invention (steps of connecting semiconductor devices). In the seventh preferred embodiment, the same or similar components as those described above are denoted by the same references and will be described below.

As shown in FIG. 13, in the seventh preferred embodiment, the plurality of RC-IGBTs 21 arranged at regular intervals in the above-mentioned y direction (predetermined direction) are connected to the first die pads 1b in the steps of connecting the semiconductor devices. That is to say, the plurality of RC-IGBTs 21 are connected in the same mounting pitch. The method for manufacturing the power modules according to the seventh preferred embodiment can perform, for example, the die bonding step of connecting the plurality of RC-IGBTs 21 in one flow and can perform this step and the die bonding step of connecting the control IC 4 in a total of two flows. In other words, the number of die bonder processes can be reduced.

<Eighth Preferred Embodiment>

Figure 14:
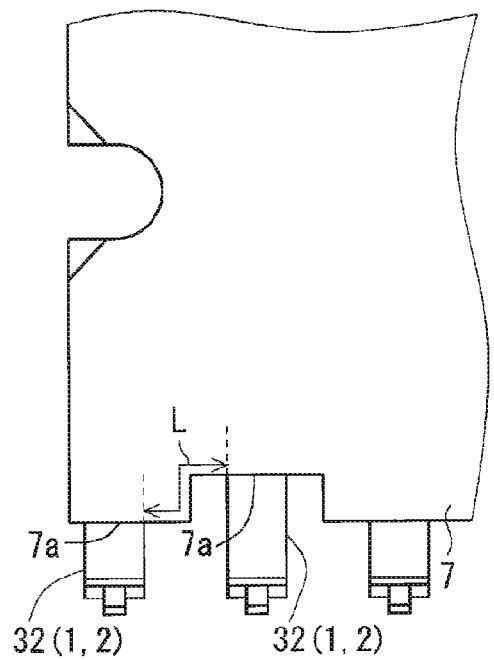
FIG. 14 is a view showing steps of manufacturing a power module according to an eighth preferred embodiment.

FIG. 14 is a view showing steps of manufacturing a power module according to an eighth preferred embodiment of the present invention. In the eighth preferred embodiment, the same or similar components as those described above are denoted by the same references and will be described below.

As shown in FIG. 14, in the eighth preferred embodiment, the molding resin 7 has projections and depressions formed on its sides in a plan view. Thus, the position of an end surface 7a of the molding resin 7 from which one frame of the frames 32 protrudes and the position of an end surface 7a of the molding resin 7 from which another frame 32 adjacent to the one frame protrudes are different in the protruding direction of the frames 32. The method for manufacturing the power modules according to the eighth preferred embodiment can increase a creepage distance L between the lead terminals 11 (frames 32), whereby the packages of the power modules can be miniaturized.

<Ninth Preferred Embodiment>

Figure 15:
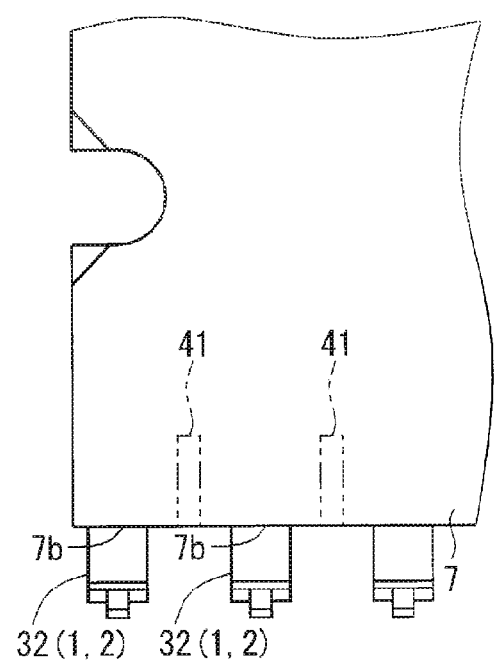
FIG. 15 is a view showing steps of manufacturing a power module according to a ninth preferred embodiment.

FIG. 15 is a view showing steps of manufacturing a power module according to a ninth preferred embodiment of the present invention. In the ninth preferred embodiment, the same or similar components as those described above are denoted by the same references and will be described below.

As shown in FIG. 15, in the ninth preferred embodiment, an insulating portion 41 is formed between an end portion 7b of the molding resin 7 from which one frame of the frames 32 protrudes and an end portion 7b of the molding resin 7 from which another frame 32 adjacent to the one frame protrudes. The method for manufacturing the power modules according to the ninth preferred embodiment can substantially increase the creepage distance between the lead terminals 11 (frames 32), whereby the packages of the power modules can be miniaturized.

<Tenth Preferred Embodiment>

Figure 16:
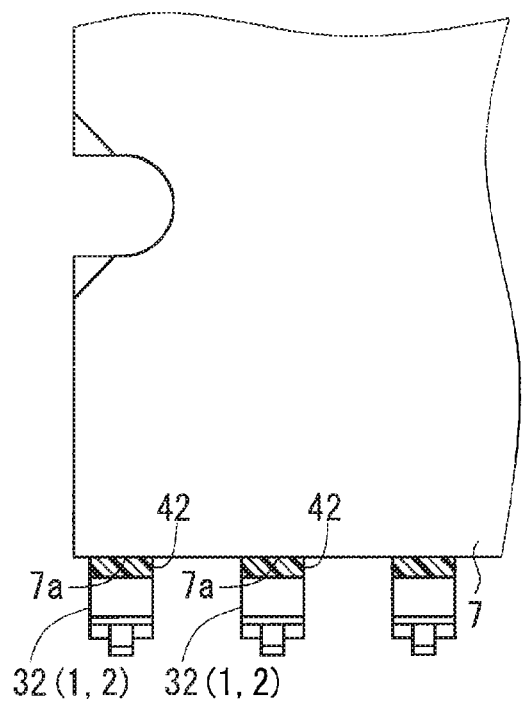
FIG. 16 is a view showing steps of manufacturing a power module according to a tenth preferred embodiment.

FIG. 16 is a view showing steps of manufacturing a power module according to a tenth preferred embodiment of the present invention. In the tenth preferred embodiment, the same or similar components as those described above are denoted by the same references and will be described below.

As shown in FIG. 16, in the tenth preferred embodiment, an insulating cap 42 is formed adjacent to the end surface 7a of the molding resin 7 from which one of the frames 32 protrudes to cover one of the frames 32. The method for manufacturing the power module according to the tenth preferred embodiment can substantially increase the creepage distance between the lead terminals 11 (frames 32), whereby the packages of the power modules can be miniaturized.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power module, comprising:
one control IC having functions of a high-voltage IC and a low-voltage IC;
a plurality of reverse conducting insulated gate bipolar transistors (RC-IGBTs) disposed on three of four sides of said control IC and connected to said control IC through only wires;
a first frame including an extending portion that extends in a horizontal direction and a first die pad which extends in the horizontal direction and on which one of said RC-IGBTs is mounted; and
a second frame including a second die pad which extends in the horizontal direction corresponding to said extending portion and on which said control IC is mounted,
wherein a step is provided between said extending portion and said first die pad such that said first die pad is located lower than said second die pad.

2. The power module according to claim 1, further comprising a frame to which control signal is input, wherein
said control IC includes a first pad formed on a front surface and a second pad formed on a back surface,
said first pad is connected to one of said RC-IGBTs through one of said wires, and
said second pad is connected to said frame.

3. The power module according to claim 1, further comprising an insulating sheet disposed under said first die pad of said first frame.

4. The power module according to claim 1, comprising metal oxide semiconductor field effect transistors (MOSFETs) formed of a silicon in place of said RC-IGBTs.

5. The power module according to claim 1, comprising metal oxide semiconductor field effect transistors (MOSFETs) formed of a silicon carbide in place of said RC-IGBTs.

6. The power module according to claim 1, further comprising a frame including a die pad on which one of said RC-IGBTs is mounted,
wherein said one of said RC-IGBTs is connected to said die pad with a resin die bonding agent.

* * * * *